United States Patent
Wang et al.

(10) Patent No.: US 9,634,703 B2
(45) Date of Patent: Apr. 25, 2017

(54) LOW POWER ENCODED SIGNAL DETECTION

(71) Applicant: Raytheon Company, Waltham, MA (US)

(72) Inventors: Zhaoyang C. Wang, Carlisle, MA (US); Steven M. Lardizabal, Westford, MA (US)

(73) Assignee: RAYTHEON COMPANY, Waltham, MA (US)

( * ) Notice: Subject to any disclaimer, the term of this patent is extended or adjusted under 35 U.S.C. 154(b) by 2 days.

(21) Appl. No.: 14/812,283

(22) Filed: Jul. 29, 2015

(65) Prior Publication Data

US 2017/0033817 A1 Feb. 2, 2017

(51) Int. Cl.
H04B 1/10 (2006.01)
H04B 1/12 (2006.01)

(52) U.S. Cl.
CPC ........... *H04B 1/123* (2013.01); *H04B 1/1036* (2013.01)

(58) Field of Classification Search
CPC ..................................................... H04B 1/123
USPC ........................................................ 455/307
See application file for complete search history.

(56) References Cited

U.S. PATENT DOCUMENTS 5,185,591 A * 2/1993 Shuey .................... H04B 3/542
340/12.33

FOREIGN PATENT DOCUMENTS

EP 1 081 870 A1 3/2001
EP 1 956 719 A2 8/2008
EP 2 096 769 A1 9/2009

OTHER PUBLICATIONS

Invitation to Pay Addtionai Fees and, Where Applicable, Protest Fee, PCT/US2016/041857, dated Oct. 26, 2016, 9 pages.
Notification of Transmittal of the International Search Report and the Written Opinion of the International Search Authority, or the Declaration, PCT/US2016/041857, dated Jan. 3, 2017, 1 page.
International Search Report, PCT/US2016/041857, dated Jan. 3, 2017, 7pages.
Written Opinion of the International Searching Authority dated Jan. 3, 2017, 12 pages.

* cited by examiner

*Primary Examiner* — Sanh Phu
(74) *Attorney, Agent, or Firm* — Daly, Crowley, Mofford & Durkee, LLP

(57) ABSTRACT

A method and receiver for detecting a signal wherein the signal is encoded the signal with a pair of spaced predetermined frequencies and wherein energy is detected in each of the pair of predetermined frequencies and in a predetermined frequency between the pair of predetermined frequencies. Energy detected in each of the pair of predetermined frequencies is compared with the energy detected in the predetermined frequency between the pair of predetermined frequencies. The detecting includes passing the encoded signal through narrow band filters, each one of the filters being tuned to a corresponding one of the pair of predetermined frequencies and the predetermined frequency between the pair of predetermined frequencies.

12 Claims, 6 Drawing Sheets

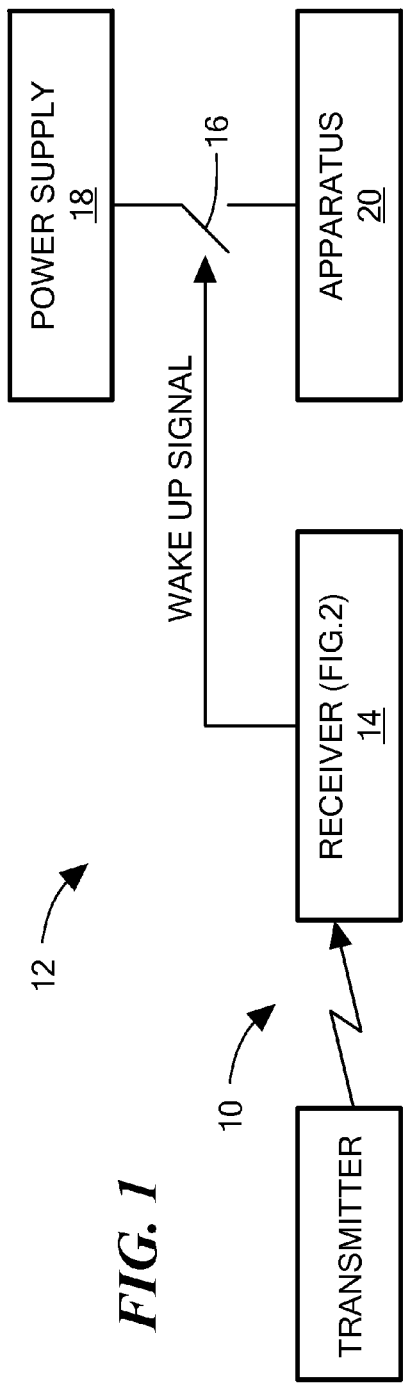
FIG. 1
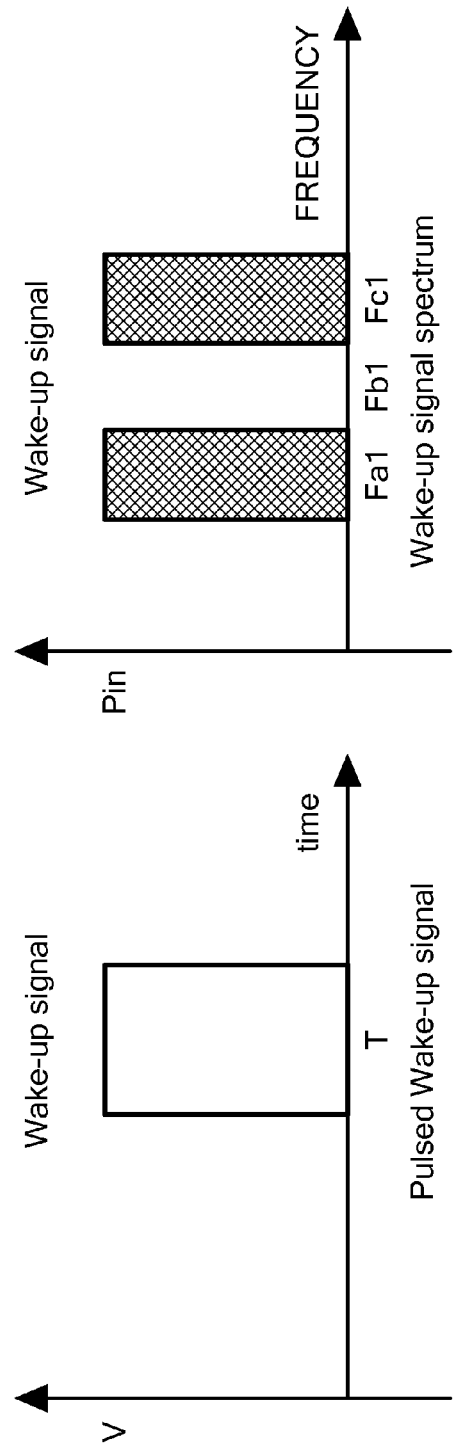
FIG. 1B
FIG. 1A

LOW POWER ENCODED SIGNAL DETECTION

TECHNICAL FIELD

This disclosure relates generally to encoded signal detectors and methods and more particularly to low power encoded signal detectors and method.

BACKGROUND

As is known in the art, detection of encoded signals, such as a "wake up" signals, is needed to activate remotely deployed, unattended wireless sensing networks. More particularly, there are systems that require zero or near zero power consuming wake-up receivers to greatly extend the lifetime of such remotely deployed unattended wireless sensing networks, which have the capability to continuously and passively monitor the environment and detect such wake-up signals.

As is also known in the art, in addition to requiring that the ultra-low power consumption, these wake-up signal receivers also require a high wake up signal detection probability in the presence of background noise.

One such wake-up signal receiver stores in a digital memory a digital code representative of a code embedded in the wake-up signal. The receiver includes digital processing circuitry, including for example a correlator, and timing circuitry response to a source of clock pules, to detect whether signals received by the receiver have embedded therein a code which correlates with the code stored in the memory. While such a receiver is able to detect the wake-up signal, it requires relatively high power consuming digital circuitry.

SUMMARY

In accordance with the present disclosure, a method and receiver is provided for detecting a signal wherein the signal is encoded the signal with a pair of spaced predetermined frequencies and wherein energy is detected in each of the pair of predetermined frequencies and in a predetermined frequency between the pair of predetermined frequencies. Energy in each of the pair of predetermined frequencies is compared with the energy in the predetermined frequency between the pair of predetermined frequencies. The detecting includes passing the encoded signal through narrow band filters, each one of the filters being tuned to a corresponding one of the pair of predetermined frequencies and the predetermined frequency between the pair of predetermined frequencies.

In one embodiment, a receiver is provided for detecting an encoded signal, having a pair of spaced predetermined frequencies, in the presence of unwanted signals having frequencies extending over the pair of spaced predetermined frequencies. The receiver includes three narrow band filters; a pair of the filters being a system for detecting an encoded signal is provided having a receiver for receiving the encoded signal together with unwanted signals having frequencies extending over the pair of spaced predetermined frequencies. The encoded signal has energy at a pair of spaced predetermined frequencies. The receiver includes: three narrow band filters, a pair of the filters being tuned to the paired predetermined frequencies for receiving energy from the encoded signal and a third one of the filters being tuned to a third predetermined frequency between the pair of frequencies for receiving energy from a portion of the unwanted signals; and a detection section for indicating detection of the encoded signal as a function of the peak voltage, which is a function of the energy, in pair of the filters tuned to the paired predetermined frequencies relative to the energy in the third one of the three filters, the energy in the third one of the three filters indicating a level of the unwanted signals having frequencies included over the pair of spaced predetermined frequencies.

In one embodiment, a receiver is provided for detecting an encoded signal, having a pair of spaced predetermined frequencies, in the presence of unwanted signals having frequencies extending over the pair of spaced predetermined frequencies. The receiver includes: three narrow band filters, a pair of the filters being tuned to a corresponding one of the paired predetermined frequencies and a third one of the filters being tuned to a third predetermined frequency between the pair of frequencies; three detector sections, each one of the detector sections being fed by a corresponding one of the three narrow band filters for producing an output representative of the energy received by such one of the three narrow band filters fed thereto, the energy in the third predetermined frequency providing a reference signal representative of the level of the unwanted signals having frequencies included over the pair of spaced predetermined frequencies; a logic section for detecting the reception of the encoded signal as a function of the level of the peak voltages in pair of the filters timed to a corresponding one of the paired predetermined frequencies relative to the energy in the third one of the pair of filters.

In one embodiment, the pair of predetermined frequencies are $f_a$ and $f_c$ and the third predetermined frequency is $f_b$, where $f_c > f_b > f_a$ and the logic section includes a pair of comparators, a first one of the comparators being fed by: one of the detector section fed by the one of the narrow band filters fed by the signal having the predetermined frequency $f_a$, and the one of the detector section fed by the one of the narrow band filters fed by the signal having the predetermined frequency $f_b$, for producing an output logic signal indicating whether the energy in the one of the narrow band filters fed by the signal having the predetermined frequency $f_a$, is greater than the energy in the one of the narrow band filters fed by the signal having the predetermined frequency $f_b$; and a second one of the comparators being fed by: the one of the detector section fed by the one of the narrow band filters fed by the signal having the predetermined frequency $f_c$, and the one of the detector section fed by the one of the narrow band filters fed by the signal having the predetermined frequency $f_b$, for producing an output logic signal indicating whether the amount of energy in the one of the narrow band filters fed by the signal having the predetermined frequency $f_c$ is greater than the energy in the one of the narrow band filters fed by the signal having the predetermined frequency $f_b$. A logic network is fed by the output logic signal produced by first one of the comparators and the logic signal produced by the second one of the comparators, for indication detection of the signal.

In one embodiment, the logic network indicates detection of the encoded signal as a function of whether both: the logic signal produced by the first comparator indicated that the energy in the one of the narrow band filters fed by the signal having the predetermined frequency $f_a$, is greater than the energy in the one of the narrow band filters fed by the signal having the predetermined frequency $f_b$; and the logic signal produced by the second comparator indicated that the energy in the one of the narrow band filters fed by the signal having the predetermined frequency $f_c$ is greater than the amount of energy in the one of the narrow band filters fed by the signal having the predetermined frequency $f_c$.

In one embodiment, a receiver is provided for detecting an encoded signal having time sequence of M pulses $P_m$, where M is an integer. Each one of the M pulses, $P_m$, includes a lower predetermined frequency, $f_{am}$, and a predetermined upper frequency $f_{cm}$, the predetermined lower frequency, $f_{am}$, and the predetermined upper frequency $f_{cm}$ being separated in frequency by a predetermined third frequency, $f_{bm}$, where $f_{cm} > f_{bm} > f_{am}$. The receiver includes three narrow band filter sections, each one of the three narrow band filter sections having M narrow band filters, each one the M narrow filters in each one of the three narrow band filter sections being tuned to a corresponding one of the three predetermined frequencies, $f_{cm}$, $f_{bm}$, and $f_{am}$. The receiver includes three detector sections, a first one of the three detector sections being fed by the M narrow band filters tuned to the predetermined frequencies $f_{am}$, a second one of the three detector sections being fed by the M narrow band filters tuned to the predetermined frequencies $f_{bm}$ and a third one of the three detector sections being fed by the M narrow band filters tuned to the predetermined frequencies $f_{cm}$. Each one of the three detector sections includes: M detector circuits, each one of the M detector circuits being fed a corresponding one of the M narrow band filters in the one of the three narrow band filter sections fed thereto. Each one of the three detection sections includes circuitry for summing peak voltages of each one the outputs of the M band pass filter fed thereto. The receiver includes a pair of comparators, a first one of the pair of comparators being fed by the first one of the three detector sections and a second one of the three detector sections, for producing an output logic signal indicating whether the sum of the peak voltages in the M narrow band filters tuned to the frequencies $f_{am}$, is greater than the sum of the peak voltages in the M narrow tuned to the frequencies $f_{bm}$; and a second one of the pair of comparators being fed by the third one of the three detector sections and the second one of the three detector sections, for producing an output logic signal indicating whether sum of the peak voltages in the M narrow band filters tuned to the frequencies $f_{cm}$ is greater than the sum of the peak voltages in the M narrow tuned to the frequencies $f_{bm}$. The receiver includes a logic network fed by the output logic signal produced by the first one of the comparators and the logic signal produced by the second one of the comparators, for indicating detection of the encoded signal when both: (a) the logic signal produced by the first comparator indicated that sum of the peak voltages in the M narrow band filters tuned to the frequencies $f_{am}$ is greater than the sum of the peak voltages in the M narrow tuned to the frequencies $f_{bm}$; and (b) the sum of the peak voltages in the M narrow band filters tuned to the frequencies $f_{cm}$ is greater than the sum of the peak voltages in the M narrow tuned to the frequencies $f_{bm}$.

In one embodiment, the detector circuits are multi-stage rectifier circuits.

In one embodiment, a method is provided for detecting a signal. The method includes: encoding the signal with a pair of spaced predetermined frequencies; and detecting the energy in each of the pair of predetermined frequencies and in a predetermined frequency between the pair of predetermined frequencies.

In one embodiment, the method includes comparing energy detected in each of the pair of predetermined frequencies with the energy detected in the predetermined frequency between the pair of predetermined frequencies.

In one embodiment, the detecting comprises passing the encoded signal through narrow band filters, each one of the filters being tuned to a corresponding one of the pair of predetermined frequencies and the predetermined frequency between the pair of predetermined frequencies.

In one embodiment, the detecting comprises passing outputs from the narrow band filters to a corresponding rectifier circuit.

In one embodiment, the detecting comprises passing outputs of the rectifiers circuits to a comparator section for comparing the peak voltages passing through the filters being tuned to the pair of predetermined frequencies with peak voltages passing through the filter tuned to the predetermined frequency between the pair of predetermined frequencies.

With such arrangements, the peak voltages in the narrow band filters tuned to the frequency between the pair of predetermined frequencies represent the received the noise and offset from the rectifier itself. This output is served as reference voltage and then compared to the detection output from the other two sets of narrow band filters. The comparators are followed by logic to identify the wakeup signal and create a wake-up signal for the rest of the wireless sensor. This system rejects wideband and random interferers. Therefore false alarm rates are reduced. To further improve the probability of detection, i.e. the receiver sensitivity, multiple groups of such three closely spaced Radio Frequency (RF) signals can be exploited as the low power wake-up signal. The signals are summed passively to linearly increase the total detection voltage.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 1 is block diagram of a wake up pulse system according to the disclosure;

FIG. 1A is a time history of a pulse transmitted by a transmitter of the wake up pulse system of FIG. 1 according to the disclosure;

FIG. 1B is the frequency spectrum of a pair of carrier frequencies transmitted by the pulse of FIG. 1A according to the disclosure;

Like reference symbols in the various drawings indicate like elements.

DETAILED DESCRIPTION

Figure 2:
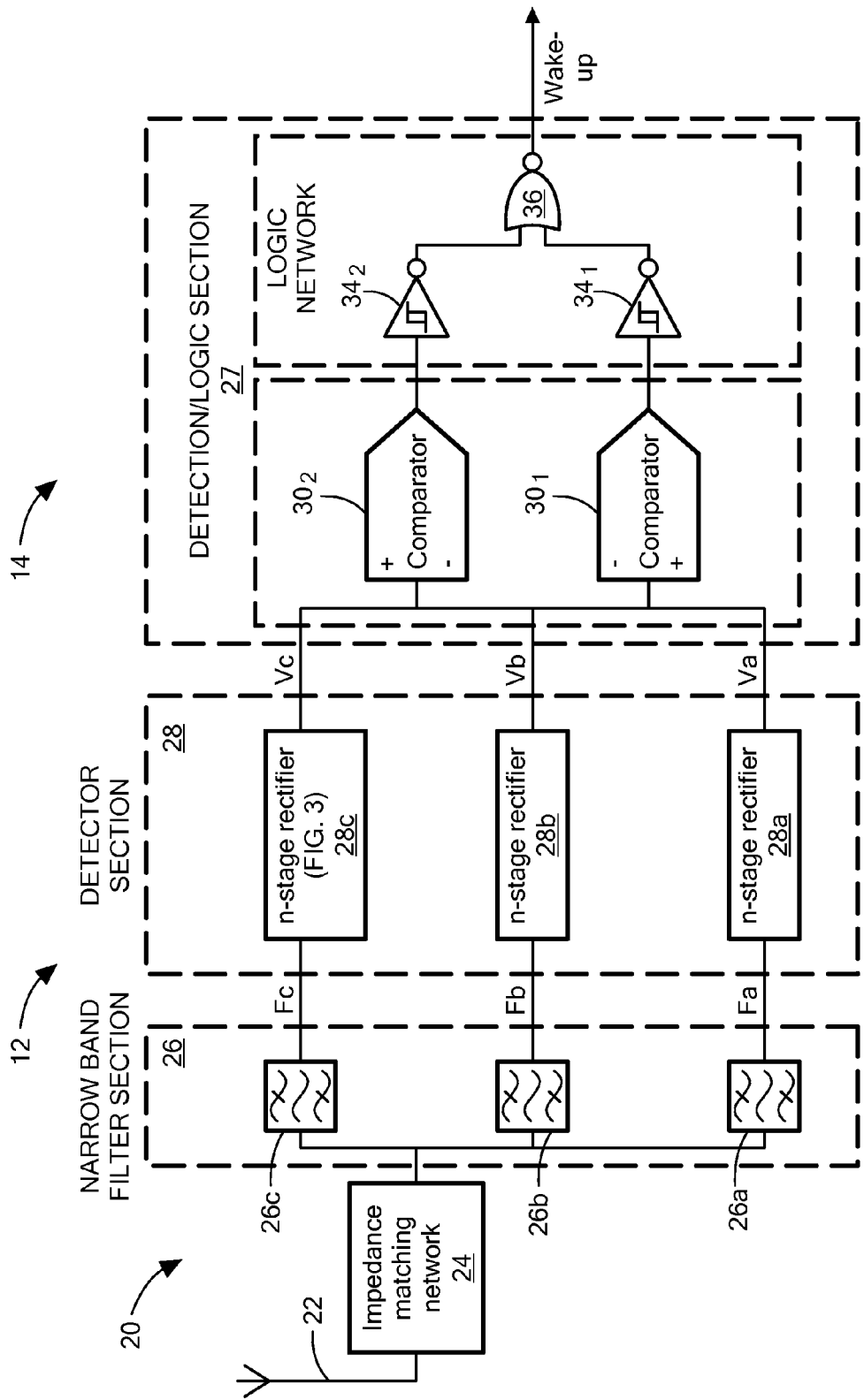
FIG. 2 is a block diagram of a receiver of the wake up pulse system of FIG. 1 according to the disclosure.

Referring now to FIG. 1, a transmitter 10 is shown for transmitting a wake up signal to a remote station 12. The remote station 12 includes a receiver 14 (FIG. 2) which operates with low power and in response to the detection of the transmitted wake up signal may, here for example, activate a switch 16 turn couple a power supply 18 for other apparatus 20 at the remote location. The transmitter wake up signal is encoded with a predetermined signature. Here the signature is a pulse (FIG. 1A) having two spaced carrier frequencies, $f_a$ and $f_c$. More particularly the time history of the encoded transmitted signal or pulse is shown in FIG. 1A and the frequency spectrum of the two RF carrier frequency signals $f_a$ and $f_c$ is shown in FIG. 1B. More particularly, the transmitted encoded signal (FIG. 1A), having a pair of spaced predetermined frequencies, $f_a$ and $f_c$ separated by a predetermined frequency, $f_b$, (FIG. 1B) is received by the receiver 14 along with unwanted signals, such as noise or other interfering signals, such unwanted signals having frequencies extending over the pair of spaced predetermined frequencies, $f_a$ and $f_c$. Thus, here $f_c > f_b > f_a$.

The receiver 14 (FIG. 2) includes a front end section, having an antenna and impedance matching network 20 having an antenna 22 and an impedance matching network 24, arranged as shown, The receiver 14 includes a narrow band filter section 26 having three narrow band filters 26a, 26b and 26c; a pair of the filters, here filters 26a and 26c being tuned to a corresponding one of the paired predetermined frequencies, $f_a$ and $f_c$, respectively, (filter 26a being timed to the frequency $f_a$ and filter 26c being tuned to the frequency $f_c$) and a third one of the filters 26b being tuned to the third predetermined frequency, $f_b$, between the pair of frequencies.

The receiver 14 includes a detection section 28 having three detector circuits, 28a, 28b and 28c, each one of the detector circuits 28a-28c being fed by a corresponding one of the three narrow band filters 26a, 26b and 26c, respectively as shown, for producing an output representative of the amount of energy, which is a function of detected peak voltage, received by such one of the three narrow band filters 26a, 26b and 26c, respectively fed thereto, the energy in the third predetermined frequency providing a reference signal representative of the level of the unwanted signals having frequencies included over the pair of spaced predetermined frequencies.

Figure 3:
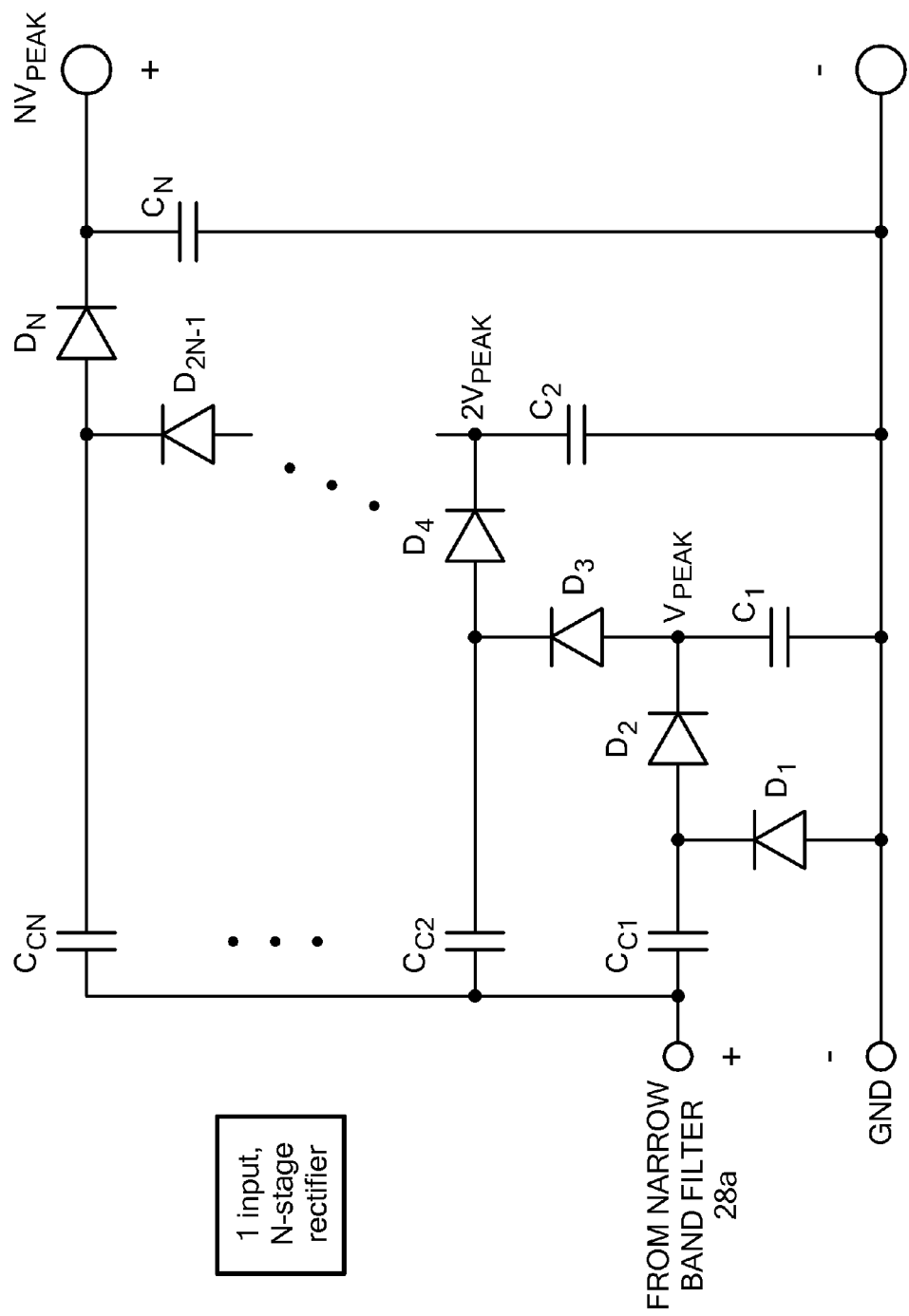
FIG. 3 is a schematic diagram of an exemplary one of a plurality of detector circuits used in the receiver of FIG. 2 according to the disclosure.

More particularly, detector circuit 28 a is fed by filter 26a, detector circuit 28b is fed by filter 26b and detector circuit 28c is fed by filter 28c; with the energy detected by circuit 28h representing the amount of energy in the third predetermined frequency, $f_b$, and thereby provides a reference signal representative of the level of the unwanted signals having frequencies included over the pair of spaced predetermined frequencies. Each one of the detector circuits 28a-28c is identical in construction; an exemplary one thereof, here detector circuit 28a being shown in detail in FIG. 3. Here the detector circuit 28a is an n-stage rectifier circuit and includes 2N, where N is an integer greater than 1, diodes D1-D2N and capacitors C1-CN and coupling capacitors $C_{C1}$-$C_{CN}$, arranged as shown to produce an output N times the peak voltage, $V_{peak}$, of the signal produced at the output of the narrow band filter 26a. More particularly, the output from the narrow band filter 26a is fed, in parallel to N, serially connected, coupling capacitors $C_{C1}$-$C_{CN}$, each of which store the peak voltage, $V_{peak}$, of the signal passing through narrow band filter 26a. The voltage $V_{peak}$ on capacitor $C_{C1}$ is coupled through diode D2 to capacitor $C_1$. In like manner the peak voltage, $V_{peak}$ of the signal passing through the narrow band filter 28a passes through diodes D2; however, the total voltage stored on capacitor $C_2$ is the stun of the peak voltages stored on capacitor $C_1$ and $C_2$; i.e., 2 $V_{peak}$.

The process continues with the result that the capacitor $C_N$ stores N $V_{peak}$. It is noted the peak voltage $V_{peak}$ is representative of the energy in the signals passing through the narrow band filters 28a-28c.

The receiver 14 (FIG. 2) also includes a detection/logic section 27 for detecting the reception of the encoded signal as a function of the level of the energy in pair of the filters tuned to a corresponding one of the paired predetermined frequencies relative to the energy in the third one of the pair of filters. More particularly detection/logic section 27 includes a pair of comparators $30_1$, $30_2$; a first one of the comparators $30_1$ being fed by: one of the detector section 28a-28c fed by the one of the narrow band filters 26a-26c fed by the signal having the predetermined frequency $f_a$, and the one of the detector section 28a-28c fed by the one of the narrow band filters 26a-26c fed by the signal having the predetermined frequency $f_b$, for producing an output logic signal indicating whether the amount of energy in the one of the narrow band filters fed by the signal having the predetermined frequency $f_a$, is greater than the amount of energy in the one of the narrow band filters fed by the signal having the predetermined frequency $f_b$. Thus, comparator $30_1$ is fed by detector circuits 28a and 28b; with the + input being coupled to the output of detector circuit 28a and the − input being coupled to detector circuit 28b, as shown.

A second one of the comparators $30_2$ is fed by: the one of the detector section 28a-28c fed by the one of the narrow band filters 26a-26c fed by the signal having the predetermined frequency $f_c$, and the one of the detector section 28a-28c fed by the one of the narrow band filters 26a-26c fed by the signal having the predetermined frequency $f_b$, for producing an output logic signal indicating whether the amount of energy in the one of the narrow band filters 26a-26c fed by the signal having the predetermined frequency $f_c$ is greater than the amount of energy in the one of the narrow band filters fed by the signal having the predetermined frequency, $f_b$. Thus, comparator $30_2$ is fed by detector circuits 28c and 28b; with the + input being coupled to the output detector circuit 28c and the − input being coupled to detector circuit 28b, as shown.

The receiver 10 also includes a logic network fed by the output logic signal produced by first one of the comparators and the logic signal produced by the second one of the comparators, for indication detection of the signal. The logic network indicates detection of the encoded signal as a function of whether both: the logic signal produced by the first comparator indicated that the amount of energy in the one of the narrow band filters fed by the signal having the predetermined frequency $f_a$, is greater than the amount of energy in the one of the narrow hand filters fed by the signal having the predetermined frequency $f_b$; and the logic signal produced by the second comparator indicated that the amount of energy in the one of the narrow band filters fed by the signal having the predetermined frequency $f_c$ is greater than the amount of energy in the one of the narrow band filters fed by the signal having the predetermined frequency $f_c$. Thus, comparator $30_2$ is fed by detector circuit 26c and 26b; with the + input being coupled to the output of detector circuit 28c and the − input being coupled to detector circuit 28b, as shown.

A logic network 32 is provided having, here for example, a pair of Schmitt triggers 34a, 34b, each one fed by a corresponding one of the pair of comparators $34_1$, $34_2$, respectively as shown. A NOR gate 36 is fed by the outputs of the pair of Schmitt triggers 34a, 34b. Thus, in operation: when the voltage at the + input to comparator $30_1$ is greater than the voltage at the − input of comparator $30_1$, the comparator $30_1$ produces a logic 1; otherwise comparator $30_1$ produces a logic 0. In like manner, when the voltage at the + input to comparator $30_2$ is greater than the voltage at the − input of comparator $30_2$, the comparator $30_2$ produces a logic 1; otherwise comparator $30_2$ produces a logic 0. The Schmitt triggers $34_1$ and $34_2$ convert a logic 1 fed thereto to a logic 0 signal and conversely converts a logic 0 signal to a logic 1 signal. Thus, a logic 1 signal is produced by NOR gate only if a logic 1 is produced by both comparator $30_1$ and comparator $30_2$. A wake up signal is produced only by a logic 1 signal at the output of the NOR gate 36.

Figure 4A:
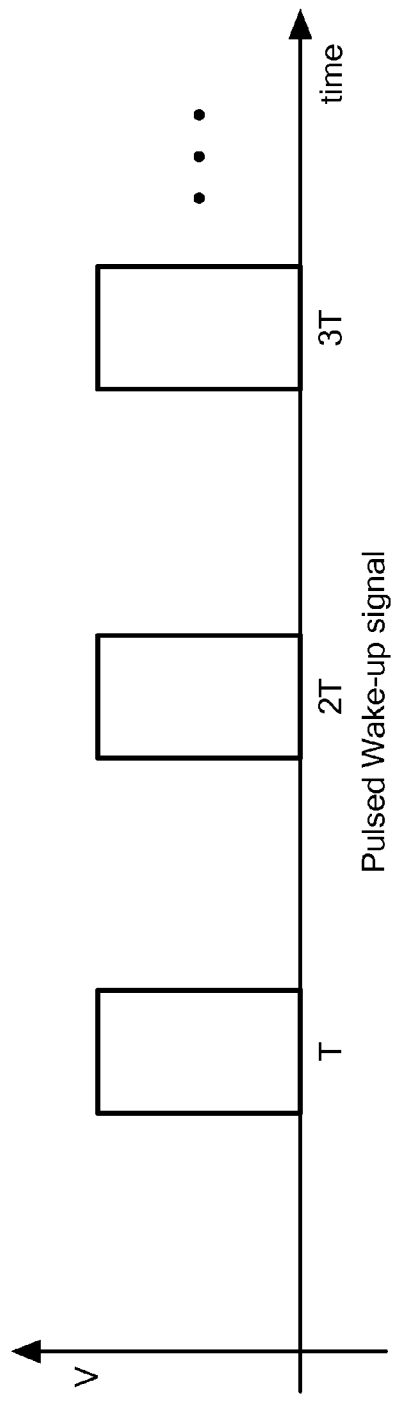
FIG. 4A is a time history of a train of pulses transmitted by a transmitter of the wake up pulse system according to another embodiment of the disclosure.
Figure 4B:
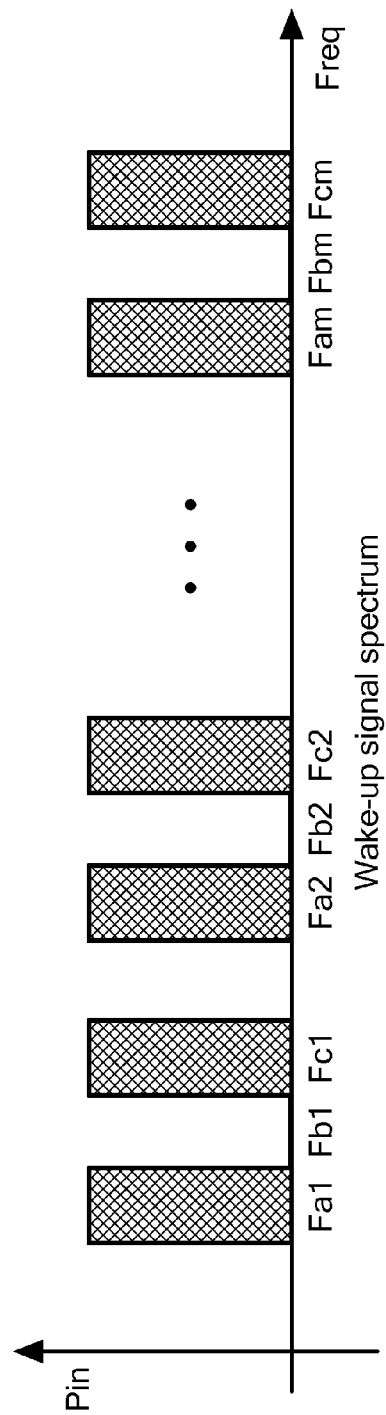
FIG. 4B is the frequency spectrum of a pair of carrier frequencies transmitted by each of the pulses of FIG. 4A according to the other embodiment of the disclosure.
Figure 5:
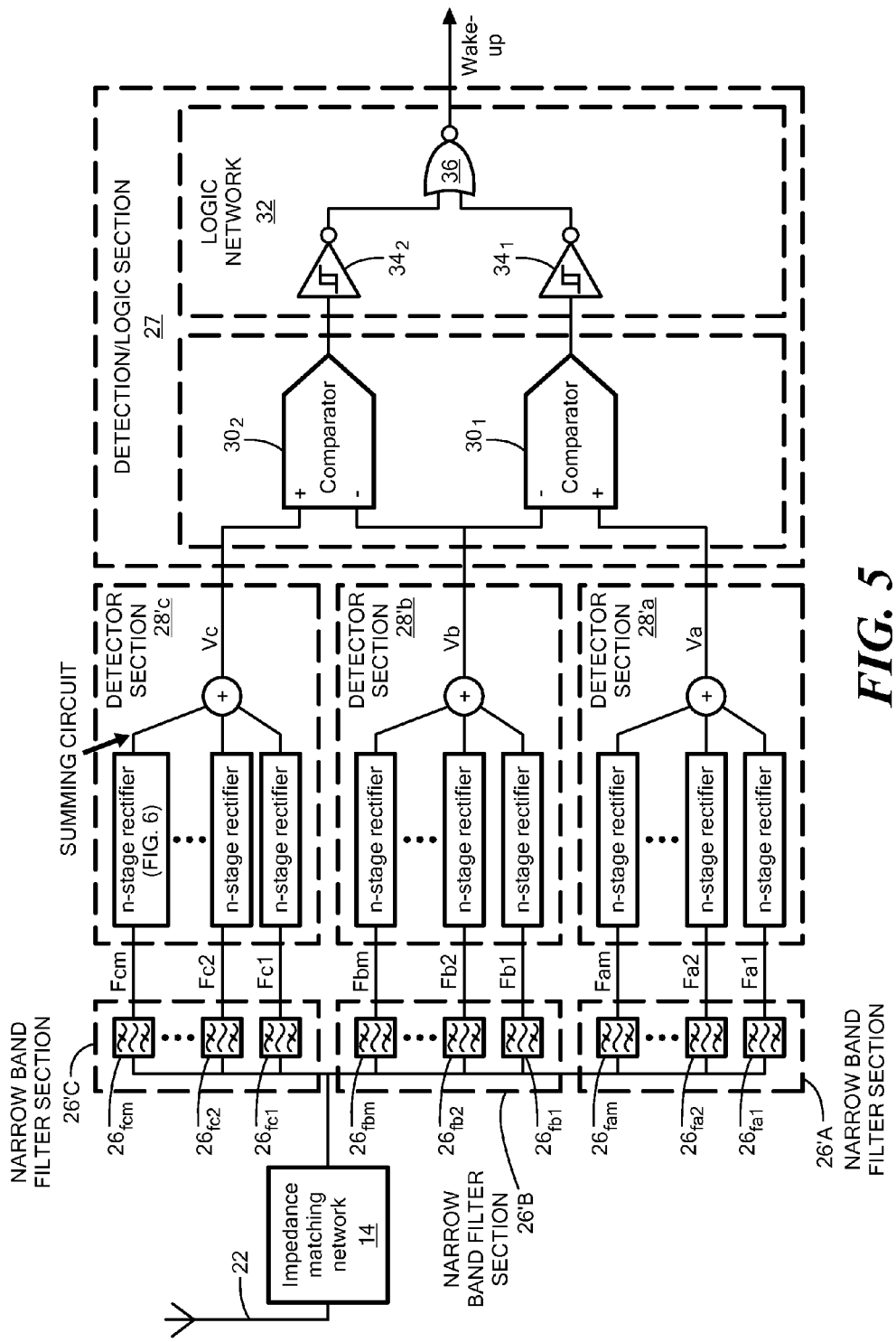
FIG. 5 is a block diagram of a receiver of the wake up pulse system of according to the other embodiment of the disclosure.

Referring now to FIG. 4, a receiver 14' is shown for detecting an encoded signal (FIG. 4A) having time sequence of M pulses $P_m$, where M is an integer, each one of the M pulses, $P_m$, includes a lower predetermined frequency, $f_{am}$ (FIG. 4B), and a predetermined upper frequency $f_{cm}$, the predetermined lower frequency, $f_{am}$, and the predetermined upper frequency $f_{cm}$ being separated in frequency by a predetermined third frequency, $f_{bm}$, where $f_{cm} > f_{bm} > f_{am}$. Here, the receiver sensitivity is improved by utilizing multiple wake-up signal pulses, here M pulses and set of three narrow band filter for the frequencies in each one of the pluses.

Thus, the first one of the pulses in the sequence, pulse $P_{m=1}$, has frequencies, $fa_1$ and $fc_1$ separated by frequency $fb_1$; the second pulses in the sequence, pulse $P_{m=2}$, has $fa_2$ and $fc_2$ separated by frequency $fb_2$; and so forth with the last pulse in the sequence, pulse $P_{m=M}$ having frequencies $fa_M$ and fc separated by the frequency $f_{bM}$.

Thus, band pass filter section 26'a includes M narrow band filters $26'_{fa1\text{-}faM}$, each one tuned to a corresponding one of the frequencies $fa_1\text{-}fa_M$, respectively; band pass filter section 2813 includes M narrow band filters $26'_{fb1\text{-}fbM}$, each one tuned to a corresponding one of the frequencies $fb_1\text{-}fb_M$, respectively; and section 28c includes M narrow band filters includes M narrow band filters $26'_{fc1\text{-}fcM}$, each one tuned to a corresponding one of the frequencies $fc_1\text{-}fc_M$, respectively, as shown.

Figure 6:
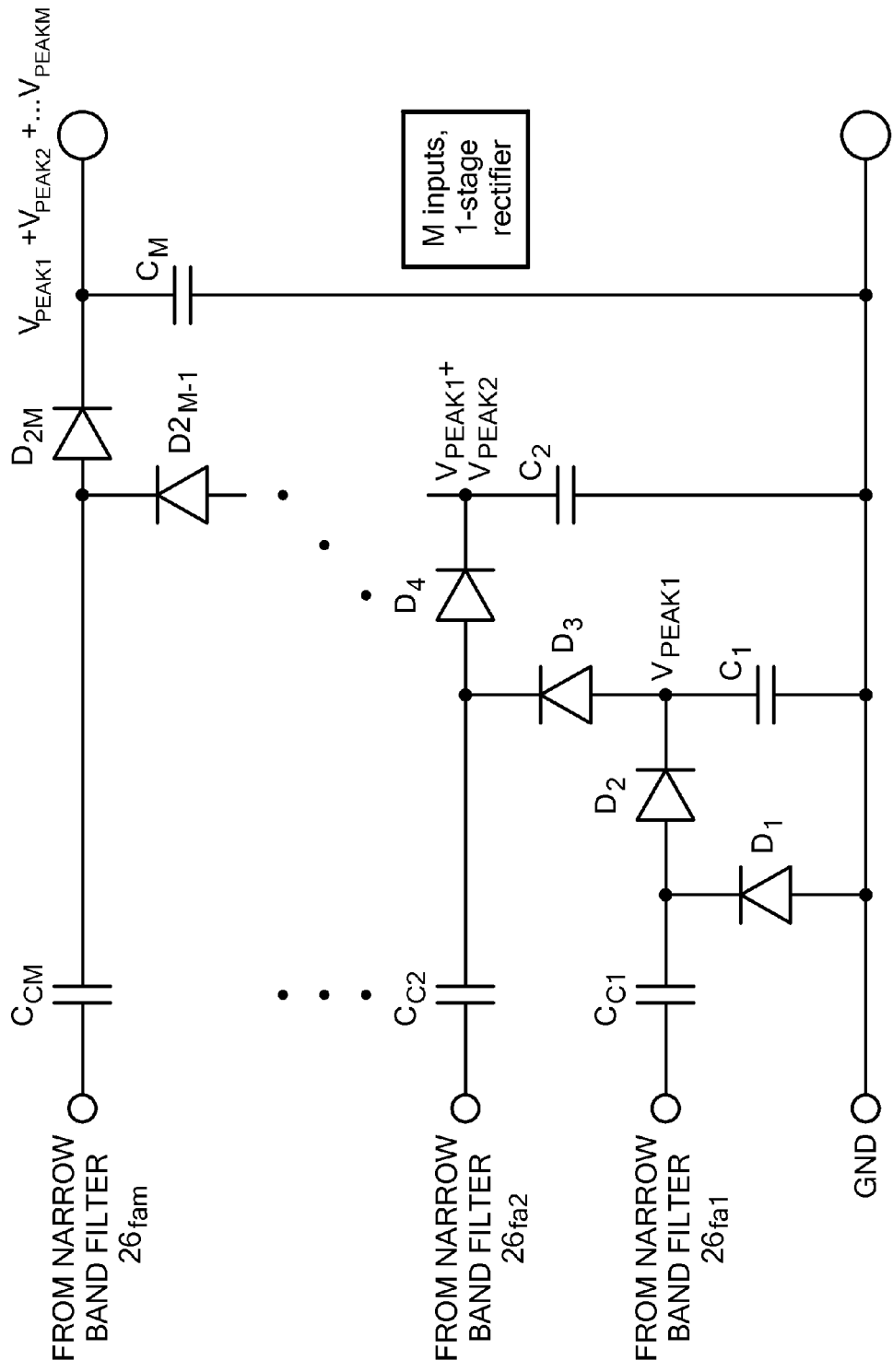
FIG. 6 is a schematic diagram of an exemplary one of a plurality of detector circuits used in the receiver of FIG. 5 according to the other embodiment of the disclosure.

The outputs of the band pass filter sections 26'a-26'c are fed to a corresponding one of three detector sections 28'a-28'c, respectively, as shown. Each one of the detector sections 28'a-28'c is identical in construction and an exemplary one thereof, here section 28'a is shown in detail in FIG. 6. Here, detection section 28'a has M inputs, each one being fed by a corresponding one of the M band pass filters $26'_{fa1}$-$26'_{faM}$ fed thereto. The section 28'a is also an n-stage rectifier circuit and includes M coupling capacitors $C_{C1}$-$C_{CM}$, 2M diodes $D_1$-$D_{2M}$ and capacitors $C_1$-$C_M$ arranged as shown to sum the peak voltages $V_{peakM}$ of each one the outputs of the M band pass filters $26'_{fa1}$-$26'_{faM}$, respectively, fed thereto, as indicated. Thus the voltage at the capacitor $C_M$ equals: $V_{peak1} + V_{peak2+} \ldots V_{peakM}$.

The outputs of the detector section 28'a-28'c are fed to a detection/logic section 27 for detecting the reception of the encoded signal as a function of the level of the energy in pairs of the filters tuned to a corresponding one of the paired predetermined frequencies relative to the energy in the third one of the pair of filters. More particularly detection/logic section 27 includes a pair of comparators $30_1$, $30_2$; a first one of the comparators $30_1$ being fed by: one of the detector sections 28'a and 28'b. More particularly, comparator $30'_1$ is fed by detector circuits 28'a and 28'b; with the + input being coupled to the output of detector circuit 28'a and the − input being coupled to detector circuit 28'b, as shown. A second one of the comparators $30'_2$ is fed by detector section 28b' and detector section 28c' with the − input being coupled to the output of detector circuit 28'c and the − input being coupled to detector circuit 28'b, as shown.

The receiver 14' also includes a logic network fed by the output logic signal produced by first one of the comparators and the logic signal produced by the second one of the comparators, for indication detection of the signal. The logic network indicates detection of the encoded signal as a function of whether both: the logic signal produced by the first comparator indicated that the amount of energy in the one of the narrow band filters fed by the signal having the predetermined frequency $f_a$, is greater than the amount of energy in the one of the narrow band filters fed by the signal having the predetermined frequency $f_b$; and the logic signal produced by the second comparator indicated that the amount of energy in the one of the narrow band filters fed by the signal having the predetermined frequency f is greater than the amount of energy in the one of the narrow band filters fed by the signal having the predetermined frequency $f_c$. Thus, comparator $30_2$ is fed by detector circuit 26c and 26b; with the − input being coupled to the output of detector circuit 28c and the − input being coupled to detector circuit 28b, as shown.

A logic network 32 is provided having, here for example, a pair of Schmitt triggers 34a, 34b, each one fed by a corresponding one of the pair of comparators $34_1$, $34_2$, respectively as shown. A NOR gate 36 is fed by the outputs of the pair of Schmitt triggers 34a, 34b. Thus, in operation: when the voltage at the + input to comparator $30_1$ is greater than the voltage at the − input of comparator $30_1$, the comparator $30_1$ produces a logic 1; otherwise comparator $30_1$ produces a logic 0. In like manner, when the voltage at the + input to comparator $30_2$ is greater than the voltage at the − input of comparator $30_2$, the comparator $30_2$ produces a logic 1; otherwise comparator $30_2$ produces a logic 0. The Schmitt triggers $34_1$ and $34_2$ convert a logic 1 fed thereto to a logic 0 signal and conversely converts a logic 0 signal to a logic 1 signal. Thus, a logic 1 signal is produced by NOR gate only if a logic 1 is produced by both comparator $30_1$ and comparator $30_2$. A wake up signal is produced only by a logic 1 signal at the output of the NOR gate 36.

Thus, the receivers include: (A) three narrow band filter sections, each one of the three narrow band filter sections having M narrow band filters, each one the M narrow filters in each one of the three narrow band filter sections being tuned to a corresponding one of the three predetermined frequencies, $f_{cm}$, $f_{bm}$, and $f_{am}$; (B) three detector sections; a first one of the three detector sections being fed by the M narrow band filters tuned to the predetermined frequencies $f_{am}$; a second one of the three detector sections being fed by the M narrow band filters tuned to the predetermined frequencies $f_{bm}$, and a third one of the three detector sections being fed by the M narrow band filters tuned to the predetermined frequencies f; wherein each one of the three detector sections includes: M detector circuits, each one of the M detector circuits being fed a corresponding one of the M narrow band filters in the one of the narrow band filter sections fed thereto; each one of the three detection sections includes circuitry for summing peak voltages of each one the outputs of the M band pass filter fed thereto; (C) a pair of comparators, a first one of the pair of comparators being fed by the first one of the three detector sections and a second one of the three detector sections, for producing an output logic signal indicating whether the amount of energy in the M narrow band filters tuned to the frequencies $f_{am}$ is greater than the amount of energy in the M narrow tuned to the frequencies $f_{bm}$; and a second one of the pair of comparators being fed by the third one of the three detector sections and the second one of the three detector sections, for producing an output logic signal indicating whether the amount of energy in the M narrow band filters tuned to the frequencies $f_{cm}$ is greater than the amount of energy in the M narrow tuned to the frequencies $f_{bm}$; and (D) a logic network fed by the output logic signal produced by first one of the comparators and the logic signal produced by the second one of the comparators, for indicating detection of the encoded signal when both: (a) the logic signal produced by the first comparator indicated that amount of energy in the amount of energy in the in narrow band filters tuned to the frequencies $f_{am}$ is greater than the amount of energy in the m narrow tuned to the frequencies $f_{bm}$; and (b) the amount of energy in the in narrow band filters tuned to the frequencies $f_{cm}$ is greater than the amount of energy in the m narrow tuned to the frequencies $f_{bm}$.

Thus, a method is provided for detecting a signal, comprising: encoding the signal with a pair of spaced predetermined frequencies; and detecting energy in each of the pair of predetermined frequencies and in a predetermined frequency between the pair of predetermined frequencies. The method includes comparing energy detected in each of the pair of predetermined frequencies with the energy detected in the predetermined frequency between the pair of predetermined frequencies. The detecting comprises passing the encoded signal through narrow band filters, each one of the filters being tuned to a corresponding one of the pair of predetermined frequencies and the predetermined frequency between the pair of predetermined frequencies. More particularly, the detecting comprises passing outputs from the narrow band filters to a corresponding rectifier circuit. Still more particularly, the detecting comprises passing outputs of the rectifiers circuits to a comparator section for comparing energy passing through the filters being tuned to the pair of predetermined frequencies with energy passing through the filter tuned to the predetermined frequency between the pair of predetermined frequencies.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A receiver for detecting an encoded signal, having a pair of spaced predetermined frequencies, in the presence of unwanted signals having frequencies extending over the pair of spaced predetermined frequencies, the receiver comprising:
    three narrow band filters, a pair of the filters being tuned to the paired predetermined frequencies for receiving energy from the encoded signal and a third one of the filters being tuned to a third predetermined frequency between the pair of frequencies for receiving energy from a portion of the unwanted signals; and
    a detection section for indicating detection of the encoded signal as a function of the energy in the pair of filters tuned to the paired predetermined frequencies relative to the energy in the third one of the three filters, the energy in the third one of the three filters indicating a level of the unwanted signals having frequencies included over the pair of spaced predetermined frequencies.

2. A receiver for detecting an encoded signal, having a pair of spaced predetermined frequencies, in the presence of unwanted signals having frequencies extending over the pair of spaced predetermined frequencies, the receiver comprising:
    three narrow band filters, a pair of the filters being tuned to a corresponding one of the paired predetermined frequencies and a third one of the filters being tuned to a third predetermined frequency between the pair of frequencies; three detector sections, each one of the detector sections being fed by a corresponding one of the three narrow band filters for producing an output representative of the amount of energy received by such one of the three narrow band filters fed thereto, the energy in the third predetermined frequency providing a reference signal representative of the level of the unwanted signals having frequencies included over the pair of spaced predetermined frequencies; and
    a logic section for detecting the reception of the encoded signal as a function of the level of the energy in the pair of filters tuned to a corresponding one of the paired predetermined frequencies relative to the energy in the third one of the pair of filters.

3. The receiver recited in claim 2 wherein pair of predetermined frequencies are $f_a$ and $f_c$ and the third predetermined frequency is $f_b$, where $f_c > f_b > f_a$ and the logic section comprises:
    a pair of comparators,
        a first one of the comparators being fed by: one of the detector section fed by the one of the narrow band filters fed by the signal having the predetermined frequency $f_a$, and the one of the detector section fed by the one of the narrow band filters fed by the signal having the predetermined frequency $f_b$, for producing an output logic signal indicating whether the amount of energy in the one of the narrow band filters fed by the signal having the predetermined frequency $f_a$, is greater than the amount of energy in the one of the narrow band filters fed by the signal having the predetermined frequency $f_b$; and
        a second one of the comparators being fed by: the one of the detector section fed by the one of the narrow band filters fed by the signal having the predetermined frequency $f_c$, and the one of the detector section fed by the one of the narrow band filters fed by the signal having the predetermined frequency $f_b$, for producing an output logic signal indicating whether the amount of energy in the one of the narrow band filters fed by the signal having the predetermined frequency $f_c$ is greater than the amount of energy in the one of the narrow band filters fed by the signal having the predetermined frequency; and
    a logic network fed by the output logic signal produced by first one of the comparators and the logic signal produced by the second one of the comparators, for indication detection of the signal.

4. The receiver recited in claim 3 wherein the logic network indicates detection of the encoded signal as a function of whether both: the logic signal produced by the first comparator indicated that the amount of energy in the one of the narrow band filters fed by the signal having the predetermined frequency $f_a$, is greater than the amount of energy in the one of the narrow band filters fed by the signal having the predetermined frequency $f_b$; and the logic signal produced by the second comparator indicated that the amount of energy in the one of the narrow band filters fed by the signal having the predetermined frequency $f_c$ is greater than the amount of energy in the one of the narrow band filters fed by the signal having the predetermined frequency $f_c$.

5. A receiver for detecting an encoded signal having time sequence of M pulses $P_m$, where M is an integer, each one of the M pulses, $P_m$, includes a lower predetermined frequency, $f_{am}$, and a predetermined upper frequency $f_{cm}$, the predetermined lower frequency, $f_{am}$, and the predetermined upper frequency $f_{cm}$ being separated in frequency by a predetermined third frequency, $f_{bm}$, where $f_{cm} > f_{bm} > f_{am}$ the receiver comprising:

(A) three narrow band filter sections, each one of the three narrow band filter sections having M narrow band filters, each one the M narrow filters in each one of the three narrow band filter sections being tuned to a corresponding one of the three predetermined frequencies, $f_{cm}$, $f_{bm}$, and $f_{am}$;

(B) three detector sections,
  a first one of the three detector sections being fed by the M narrow band filters tuned to the predetermined frequencies $f_{am}$,
  a second one of the three detector sections being fed by the M narrow band filters tuned to the predetermined frequencies $f_{bm}$, and
  a third one of the three detector sections being fed by the M narrow band filters tuned to the predetermined frequencies $f_{cm}$; wherein
  each one of the three detector sections includes:
    M detector circuits, each one of the M detector circuits being fed a corresponding one of the M narrow band filters in the one of the narrow band filter sections fed thereto; each one of the three detection sections includes circuitry for summing peak voltages of each one the outputs of the M band pass filter fed thereto (C) a pair of comparators,
  a first one of the pair of comparators being fed by the first one of the three detector sections and a second one of the three detector sections, for producing an output logic signal indicating whether the amount of energy in the M narrow band filters tuned to the frequencies $f_{am}$ is greater than the amount of energy in the M narrow tuned to the frequencies $f_{bm}$; and
  a second one of the pair of comparators being fed by the third one of the three summers and the second one of the three detector sections, for producing an output logic signal indicating whether the amount of energy in the M narrow band filters tuned to the frequencies $f_{cm}$ is greater than the amount of energy in the M narrow tuned to the frequencies $f_{bm}$; and (D) a logic network fed by the output logic signal produced by first one of the comparators and the logic signal produced by the second one of the comparators, for indicating detection of the encoded signal when both: (a) the logic signal produced by the first comparator indicated that amount of energy in the amount of energy in the m narrow band filters tuned to the frequencies $f_{am}$ is greater than the amount of energy in the m narrow tuned to the frequencies $f_{bm}$; and (b) the amount of energy in the m narrow band filters tuned to the frequencies $f_{cm}$ is greater than the amount of energy in the m narrow tuned to the frequencies $f_{bm}$.

6. The receiver recited in claim 1 wherein the detection section includes rectifier circuits.

7. The receiver recited in claim 2 wherein the logic section includes rectifier circuits.

8. The receiver recited in claim 3 wherein the logic section includes rectifier circuits.

9. The receiver recited in claim 4 wherein the detector circuits comprise rectifier circuits.

10. The receiver recited in claim 7 wherein the rectifier circuits are multi-stage rectifier circuits.

11. The receiver recited in claim 8 wherein the rectifier circuits are multi-stage rectifier circuits.

12. The receiver recited in claim 9 wherein the rectifier circuits are multi-stage rectifier circuits.

\* \* \* \* \*